United States Patent
Hannam et al.

(10) Patent No.: US 9,719,371 B2
(45) Date of Patent: Aug. 1, 2017

(54) VANE SEGMENT FOR A GAS TURBINE COATED WITH A MCRALY COATING AND TBC PATCHES

(71) Applicant: Siemens Aktiengesellschaft, Munich (DE)

(72) Inventors: Steve Hannam, North Hykeham (GB); Paul Jenkinson, Lincoln (GB); Paul Padley, Tattershall (GB); Paul Mathew Walker, Dunholme (GB)

(73) Assignee: Siemens Aktiengesellschaft, Munich (DE)

( * ) Notice: Subject to any disclaimer, the term of this patent is extended or adjusted under 35 U.S.C. 154(b) by 226 days.

(21) Appl. No.: 14/652,108

(22) PCT Filed: Dec. 16, 2013

(86) PCT No.: PCT/EP2013/076762
§ 371 (c)(1),
(2) Date: Jun. 13, 2015

(87) PCT Pub. No.: WO2014/095758
PCT Pub. Date: Jun. 26, 2014

(65) Prior Publication Data
US 2015/0322818 A1    Nov. 12, 2015

(30) Foreign Application Priority Data
Dec. 20, 2012    (EP) ..................................... 12198657

(51) Int. Cl.
*F01D 5/28*    (2006.01)
*F01D 25/08*    (2006.01)
(Continued)

(52) U.S. Cl.
CPC .............. *F01D 25/08* (2013.01); *C23C 4/134* (2016.01); *C23C 14/22* (2013.01); *C25D 3/56* (2013.01);
(Continued)

(58) Field of Classification Search
CPC .......... F01D 5/288; F01D 9/041; F01D 25/08; F05D 2260/231; F05D 2230/313; F05D 2230/90; F05D 2240/15
(Continued)

(56) References Cited

U.S. PATENT DOCUMENTS

| | | | |
|---|---|---|---|
| 5,328,331 A | 7/1994 | Bunker et al. | |
| 5,525,038 A | 6/1996 | Sharma et al. | |

(Continued)

FOREIGN PATENT DOCUMENTS

| | | |
|---|---|---|
| DE | 102006048685 A1 | 4/2008 |
| EP | 0980960 A2 | 2/2000 |

(Continued)

OTHER PUBLICATIONS

RU Office Action dated Nov. 17, 2016, for RU patent application No. 2015124079.

*Primary Examiner* — Matthew W Jellett
(74) *Attorney, Agent, or Firm* — Beusse Wolter Sanks & Maire (57) ABSTRACT

A vane device for a gas turbine is provided. The vane device includes a first airfoil having a first suction side and a first pressure side, a second airfoil having a second suction side and a second pressure side, an inner shroud and an outer shroud. The first airfoil and the second airfoil are arranged between the inner shroud and the outer shroud, wherein the first airfoil and the second airfoil are at least partially coated with a MCrAlY coating. At least the first suction side has a first coated surface section which is coated with a thermal (Continued)

barrier coating and which represents at least a part of the total surface of the first suction side. At least the inner shroud or the outer shroud has a further coated surface section which is coated with a further thermal barrier coating. A corresponding method of manufacturing is also provided.

8 Claims, 3 Drawing Sheets (51) Int. Cl.
    *C23C 14/22*     (2006.01)
    *F01D 9/02*     (2006.01)
    *C25D 3/56*     (2006.01)
    *F01D 9/04*     (2006.01)
    *C23C 4/134*     (2016.01)

(52) U.S. Cl.
    CPC ............... *F01D 5/288* (2013.01); *F01D 9/02* (2013.01); *F01D 9/041* (2013.01); *F05D 2220/32* (2013.01); *F05D 2230/311* (2013.01); *F05D 2230/312* (2013.01); *F05D 2230/313* (2013.01); *F05D 2240/12* (2013.01); *F05D 2240/15* (2013.01); *F05D 2260/231* (2013.01)

(58) Field of Classification Search
    USPC ...... 415/177; 416/95, 97 A; 427/419.1, 456, 427/597
    See application file for complete search history.

(56) References Cited

U.S. PATENT DOCUMENTS

| | | | |
|---|---|---|---|
| 6,106,231 A | 8/2000 | Clarke | |
| 6,126,400 A | 10/2000 | Tressler | |
| 6,296,447 B1 * | 10/2001 | Rigney | C23C 4/00 415/217.1 |
| 9,567,664 B2 * | 2/2017 | Bolz | C23C 14/083 |
| 2001/0053424 A1 * | 12/2001 | Schaeffer | C22C 19/03 427/585 |
| 2003/0143064 A1 | 7/2003 | Texier et al. | |
| 2007/0141368 A1 | 6/2007 | Guentert | |
| 2009/0074961 A1 | 3/2009 | Kulkarni | |
| 2009/0250153 A1 | 10/2009 | Meschter et al. | |
| 2009/0311090 A1 | 12/2009 | Briggs | |
| 2011/0038710 A1 | 2/2011 | Klemm-Toole | |

FOREIGN PATENT DOCUMENTS

| | | |
|---|---|---|
| EP | 2362068 A1 | 8/2011 |
| JP | H07127401 A | 5/1995 |
| RU | 2435673 C2 | 12/2011 |

* cited by examiner

VANE SEGMENT FOR A GAS TURBINE COATED WITH A MCRALY COATING AND TBC PATCHES

CROSS REFERENCE TO RELATED APPLICATIONS

This application is the US National Stage of International Application No. PCT/EP2013/076762 filed Dec. 16, 2013, and claims the benefit thereof. The International Application claims the benefit of European Application No. EP12198657 filed Dec. 20, 2012. All of the applications are incorporated by reference herein in their entirety.

FIELD OF INVENTION

The present invention relates to a vane segment for a gas turbine with a MCrAlY coating and a TBC (Thermal Barrier Coating) and to a method for manufacturing an airfoil arrangement for a gas turbine.

ART BACKGROUND

The stator vanes and the rotor blades in a gas turbine are exposed to the high temperature of the working fluid passing the vanes and the blades. Due to the high temperature a significant oxidation of the base alloy can occur at the leading edge of an airfoil of the stator vane or, the rotor blade. Furthermore, oxidation at the inner platform of the inner shroud and/or outer shroud of the stator vane or the rotor blade can also occur. Such degradation is currently the life limiting mechanism on this component.

EP 0 980 960 A2 discloses a bowed nozzle vane with a selective thermal barrier coating. A turbine nozzle comprises an outer band and an inner band between which a plurality of vanes extends. The vanes comprise respective leading edges and trailing edges. Furthermore, one side of the respective vanes is a pressure side and the opposed side is a suction side extending between the leading edge and the trailing edge.

EP 2 362 068 A1 discloses a turbine airfoil which comprises an airfoil body with a leading edge, a trailing edge, an exterior surface including a suction side extending from the leading edge to the trailing edge and a pressure side extending from the leading edge to the trailing edge. Furthermore, a thermal barrier coating system is presented in a coated surface section and an uncoated surface region where a thermal barrier coating system is not present is disclosed. The thermal barrier coating system is located at a suction side of the turbine airfoil.

U.S. Pat. No. 6,126,400 A1 discloses a thermal barrier coating wrap for a turbine airfoil. An airfoil body comprises a leading edge and a trailing edge. Furthermore, the airfoil body comprises a convex side extending between the leading edge and the trailing edge. The airfoil body extends between a radially outer band and a radially inner band comprising a base. A thermal barrier coating is applied e.g. to both sides of the airfoil body.

DE 10 2006 048 685 discloses a turbine vane with a thermal barrier coating. A layer thickness of the thermal barrier coating on the suction side decreases continuously initially up to a narrow point of a flow channel inside the turbine vane and then increases continuously again.

U.S. Pat. No. 6,106,231 A discloses a partially coated airfoil comprising a leading edge and a trailing edge. The surfaces of concave side, convex side, leading edge and trailing edge define an outer surface of the airfoil.

US 2009/0074961 A1 comprises a ceramic coating for imparting one or more of a variety of functional characteristics to one or more components or portions of an engine, such as blades, vanes and shrouds of a turbine engine. The surfaces of the components may be partially coated with a ceramic coating.

SUMMARY OF THE INVENTION

It may be an object of the present invention to provide a more heat resistant vane segment for a gas turbine with reduced manufacturing cost and weight.

This object may be solved by a vane segment for a gas turbine and by a method for manufacturing a vane segment arrangement for a gas turbine.

According to a first aspect of the present invention, a vane device (segment) for a gas turbine is presented. The vane device comprises a first airfoil comprising a first suction side and a first pressure side, a second airfoil comprising a second suction side and a second pressure side, an inner shroud and an outer shroud. The first airfoil and the second airfoil are arranged between the inner shroud and the outer shroud. The first airfoil and the second airfoil (and e.g. the inner and/or outer shroud) are at least partially coated with a MCrAlY coating. At least the first suction side comprises a first coated surface section (e.g. a coated "patch") which is coated with a thermal barrier coating and which represents at least a part of the total surface of the first suction side. At least the inner shroud or the outer shroud comprises a further coated surface section which is coated with a further thermal barrier coating (e.g. a coated further "patch"). The further coated surface section represents at least a part of the total surface of the respective inner shroud or the respective outer shroud.

According to a further aspect of the present invention a method for manufacturing the above described vane segment is presented. The vane segment is e.g. is fixed to a casing of the gas turbine.

The respective first or second airfoil comprises a leading edge and a trailing edge. At the leading edge, the airfoil has a maximum curvature, for example. Generally, the fluid which flows against the respective airfoil contacts firstly the leading edge and the fluid is separated in a first part which flows along the suction side of the airfoil and in a second part which flows along the pressure side of the airfoil. The suction side is generally associated with higher velocity and thus lower static pressure. The pressure side has a comparatively higher static pressure than the suction side. The trailing edge defines the edge of the airfoil where the fluid flowing along the suction surface and the fluid flowing along the pressure surface is again emerged to one flow stream.

The vane segment may comprise the first and the second airfoil or a plurality of further airfoils which are spaced apart from each other along a circumferential direction with respect to a rotary axis of the gas turbine.

The vane segment further comprises the inner shroud and the outer shroud. The respective airfoils are arranged between the inner shroud and the outer shroud. In particular, the respective leading edges and the respective trailing edges extend between the inner shroud and the outer shroud.

The inner shroud is located closer to the rotary axis of the gas turbine than the outer shroud. The inner shroud comprises an inner platform with an inner surface and the outer shroud comprises a further inner platform with a further inner surface, wherein respective inner surfaces of the inner platforms face the inner volume of the gas turbine through which inner volume the hot working gas streams. Hence, the respective inner surfaces of the inner platforms are gas-washed by the hot working gas of the gas turbine.

The hot working gas contacts first of all the leading edge section of the airfoil before flowing in an advantageously laminar manner along the suction side or the pressure side to the trailing edge section. Hence, high oxidation of the airfoils may be experienced due to the high temperature of the working gas.

According to the present approach, at least some sections of the vane segment, such as the first and second airfoil or the parts of the inner and outer shroud, are coated with the MCrAlY coating. Directly onto the MCrAlY coating or directly onto a bond coating, a locally determined coated surface section coated with a thermal barrier coating (TBC), i.e. a TBC patch, is applied. Specifically the coated surface section is applied at regions of the respective first and second airfoils, where the hottest regions at the airfoil exist. For this reason, the coated surface section coated with the TBC coating is located at a suction side of the first and/or second airfoil. The coated surface section may cover the complete suction side or may cover only partially the suction side of a respective airfoil. In particular, the thermal barrier coating is located at the suction side closer to the trailing edge than to the leading edge. The coated surface may comprise a plurality of TBC patches which are spaced apart from each other and which are coated with a desired pattern within the coated surface section.

Furthermore, directly onto the surface of the inner or outer shroud, e.g. onto an inner surface of an inner platform of the respective shroud, a MCrAlY coating is at least partially applied. Furthermore, a locally determined further coated surface section coated with a thermal barrier coating (TBC), a so called further TBC patch, is applied. Specifically the further coated surface section is applied at regions of the inner platform, where the hottest regions exist. For this reason, the further coated surface section coated with the further TBC coating may be located at a downstream location with respect to a trailing edge of an airfoil at the respective inner surface of the inner platform. The further coated surface section is located onto the inner platform and/or the outer platform at a section which is located downstream of the first trailing edge and the second trailing edge.

Hence, by the present invention, a thermal barrier coating is coated to the hottest spots at surfaces of the vane segment, in particular at the inner platform of a shroud and at a suction side of an airfoil. The combination of so called TBC-patches at the suction side of a vane and at the inner platform leads to a proper resistance against heat and additionally to a low overall weight and material costs of the vane device. Specifically, the pressure sides of the airfoil may be free of a TBC coating.

The thermal barrier coating may comprise a ceramic component. The TBC coating may be deposited by a method such as Electron Beam Physical Vapour Deposition (EBPVD) or Air Plasma Spray (APS), but is not limited to this technique. The TBC coating reduces the temperature on the airfoil and the respective inner platform and hence increases the lifetime of the airfoil.

The TBC may be required on the airfoil. The (ceramic) TBC reduces the temperature of the airfoil. The (ceramic) TBC however may require a bond coat to enable it to adhere to the substrate of the vane device, i.e. the airfoil and/or the inner or outer shroud. In this case e.g. a PtAl coating or the MCrAlY coating is used as a bond coat. The bond coating prevents spallation of the TBC (ceramic) coating from the substrate of the airfoil because it palliates thermal expansion differences between the metal of the airfoil and ceramics of the thermal barrier coating. Additionally there may be an internal coating of the aerofoil to provide oxidation and corrosion protection.

The substrate of the vane device, i.e. the airfoil and/or the inner or outer shroud, may comprise e.g. a MAR-M-247 alloy.

The MCrAlY composition comprises indicated by the "M" in particular Nickel (Ni), Cobalt (Co) or a mixture of both. The MCrAlY coating may be coated onto the coated surface section by application methods such as electroplating, thermal spray techniques or Electron Beam Vapour Phase Deposition (EBPVD) However, these are example application methods and other processes could be used.

Furthermore, in order to provide the proper oxidation protection, the thickness of the MCrAlY coating may be between (approximately) 0.025 mm to (approximately) 0.3 mm, in particular between (approximately) 0.05 mm to (approximately) 0.25 mm.

According to a further exemplary embodiment, the thermal barrier coating and/or the further thermal barrier coating comprises a thinning out section, wherein in the thinning out section the thickness of the thermal barrier coating is smoothly reduced in a direction to an edge of the respective coated surface section and/or the further coated surface section. Between the coated surface section and the inner shroud on the one side and/or between the coated surface section and the outer shroud on the other side the thinning out section (transition section) is formed onto a surface of the airfoil. In the thinning out section, the thickness of the TBC coating, i.e. the ceramic coating, is smoothly reduced from the edge of the coated surface section to the inner and the outer shroud, respectively. In other words, the thickness of the thermal barrier coating is thinning out (in particular till zero thickness) from the edge of the coated surface section to the inner and the outer shroud, respectively, so that i.e. the first inner platform and/or the second inner platform which is/are washed by working fluid of the turbine is/are predominantly free of a TBC. Thus, a smooth reduction in coating thickness may be present from an end of the coated surface section to the inner and the outer shroud, respectively.

At the transition section (thinning out section) the TBC coating tapers to zero thickness e.g. in the fillet radii (i.e. the curvature between the coated section of the airfoil surface and the shroud (platform) surface). The reason for this is that the shroud surface may be largely free from a TBC coating. Rather than having an abrupt thickness step in the transition section, where the TBC coating goes from full thickness to zero, the TBC coating naturally tapers (feathers) out.

The first airfoil and the second airfoil partly define a throat area or plane and wherein the first pressure side and the second pressure side may be free of a thermal barrier coating in the throat area or plane.

The extension of the coated surface section from the trailing edge in the direction to the leading edge may be in the region between 50% and 80% of the dimension between the trailing edge and the leading edge of the aerofoil.

The thermal barrier coating patch may be spaced from the inner shroud and the outer shroud with a first distance, the first distance, at the extremity of the TBC to the respective platform, may be between approximately 0% and approximately 45% of a total length (100%) of the airfoil between the inner shroud and the outer shroud.

The first distance may be between approximately 5% and approximately 25% of a total length of the airfoil between the inner shroud and the outer shroud.

The further coated surface section has a width extending from the platform trailing edge a distance between approximately 50% to approximately 80% of a dimension from the platform trailing edge to aerofoil trailing edge.

According to a further exemplary embodiment, the coated surface section is separated from the inner shroud and/or the outer shroud. In the transition section the thickness of the TBC coating goes from coated to un-coated. The TBC coating may thus cover the airfoil surfaces and/or the transition section between the respective airfoil and the inner shroud or the outer shroud (e.g. in the radii adjoining the airfoils/shrouds).

Furthermore, according to a further exemplary embodiment of the present invention, the coated surface section, i.e. the thermal barrier coating patch, onto the substrate of the airfoil is spaced e.g. from the inner shroud and the outer shroud with a first distance. The first distance, at the extremity of the TBC to the respective platform, may be between (approximately) 0% and (approximately) 45%, in particular between (approximately) 5% and (approximately) 25% of a total length (100%) of the airfoil between the inner shroud and the outer shroud. A coating thinning out section may be still located between the coated surface section and the inner shroud or the outer shroud. In the thinning out section the thickness of the coating is constantly reduced along a run to the inner or outer shroud until no coating is left at the inner or outer shroud.

Particularly, in a further exemplary embodiment, the distance may be between (approximately) 0.5 cm and (approximately) 5.0 cm, in particular between (approximately) 1.5 cm and (approximately) 2.5 cm. The thinning out section may be still located between the coated surface section and the inner shroud or the outer shroud.

In a further exemplary embodiment, the thermal barrier coating has a thickness between (approximately) 0.05 mm to (approximately) 0.75 mm, in particular between (approximately) 0.15 mm to (approximately) 0.50 mm.

The MCrAlY coated surface section may be over-aluminised to afford additional oxidation and corrosion protection to the coating via such methods as pack cementation or VPA but, is not limited to these processes.

During or after coating of the airfoil at the coated surface section and the further coated surface section, the vane device may be exposed to a heat treatment, so that a diffusion between the coated layers in particular of aluminium occurs. Additional, a final ageing heat treatment may be applied for the component substrate material.

Finally if required, a post coating surface finish may be applied to the coated surface section and/or the further coated surface section in order to achieve a roughness of approximately Ra=1.0 Micrometer to Ra=8 Micrometer for the coating, however this is not essential.

It should be noted that by limiting TBC application to specific areas and in particular the two specific areas including the suction side of the aerofoil and the platform on the component the vane device is not inadvertently affected in the non-coated areas such as the inner shroud directly between aerofoils or the pressure side of the aerofoil. By adding a TBC patch to the very specific local areas, that otherwise would restrict component life because they incur excessive in-service temperatures, the advantage of the high or higher temperature protection whilst not unduly affecting performance of the component is realised.

Addition of TBC patches' will enable the vane device to achieve longer service life by preventing premature high temperature oxidation caused by the excessive temperatures experienced. For the present invention, this will be achieved without unduly affecting the surface finish and aerodynamics of the vane device's 'throat area' and/or pressure surface which could affect stage and engine performance. The throat area is usually defined as the minimum area between adjacent aerofoils and the TBC patches are not applied in the throat area, in other words the throat area if free from TBC. Application of a TBC coating all over the component would reduce the throat area by reducing the area and could subsequently affect performance.

Where the present invention is implemented as a retrofit to an existing or in-service component, applying the TBC on all surfaces or even one or more elements of the vane device, e.g. the aerofoil or platform, could be detrimental to the component. TBC require a temperature gradient through or across the coating thickness for them to function most favourably. If there is no or a low temperature gradient the underlying substrate of the component can 'heat sink' resulting in high thermal distortions and subsequently causing the TBC to spall prematurely.

Furthermore, the TBC can deplete the underlying MCrAlY of its protective constitutional elements and the life of the component can be reduced because the MCrAlY would then not afford sufficient protection in oxidation and/or corrosion depending on degradation mechanism. This would mean the underlying MCrAlY would be compromised leading to the onset of component base material or substrate attack.

Yet further, premature and/or local spallation of a TBC coating from the 'other' areas than the present TBC patches could also affect aerodynamics for example because of step edges of remaining TBC. Additionally, spallation of the TBC could lead to rougher gas washed surfaces which can increase the oxidation rate of the coating or substrate because rougher surfaces increase heat transfer. This roughening can lead to more accelerated oxidation and shorter life than if the component had no TBC applied i.e. where there was only a MCrAlY layer which formed a smooth gas washed surface.

Essentially the present invention applies the TBC patches in certain locations to achieve increased longevity while obviating the disadvantages discussed above.

A particular method of MCrAlY application is electroplating, which does not have the disadvantages of requiring a 'a line of sight' that other coating methods can suffer. Electroplating is particularly suitable to multi-aerofoil nozzle guide vanes such as that described herein. In addition, electro-plating an MCrAlY coating is advantageous because the thickness and extent of the coating is controllable to a relatively high tolerance.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless otherwise notified, in addition to any combination of features belonging to one type of subject matter also any combination between features relating to different subject matters, in particular between features of the apparatus type claims and features of the method type claims is considered as to be disclosed with this application.

BRIEF DESCRIPTION OF THE DRAWINGS

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION

The illustrations in the drawings are schematical. It is noted that in different figures, similar or identical elements are provided with the same reference signs.

Figure 1:
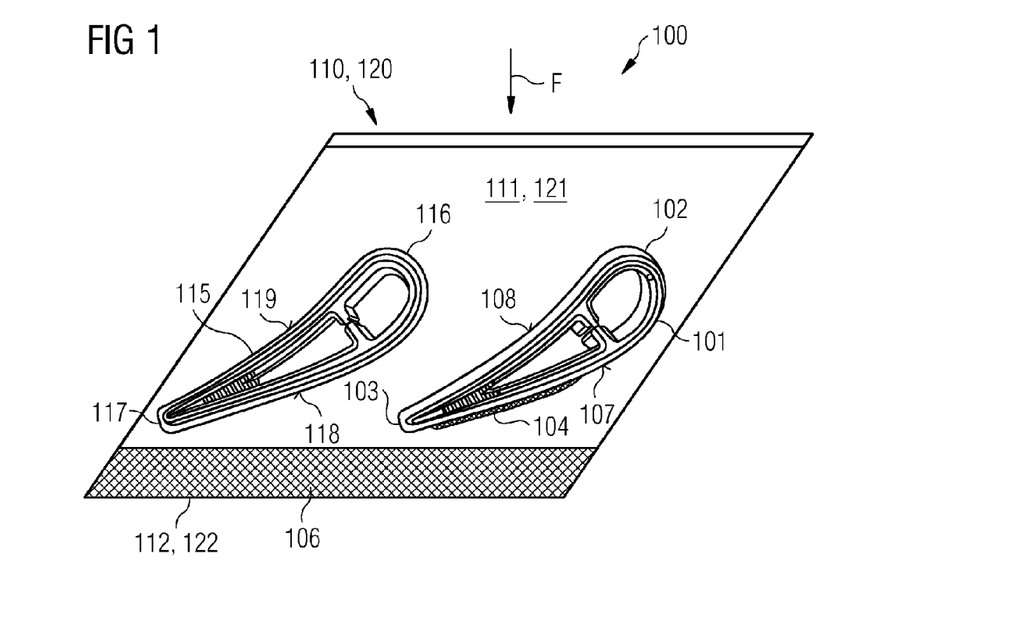
FIG. 1 shows a schematical view of a vane segment comprising two airfoils according to an exemplary embodiment of the present invention.

FIG. 1 shows a vane device (segment) 100 for a gas turbine. The vane device 100 comprises a first airfoil 101 comprising a first suction side 107 and a first pressure side 108, a second airfoil 115 comprising a second suction side 118 and a second pressure side 119, an inner shroud 110 and an outer shroud 120.

The first airfoil 101 and the second airfoil 115 are arranged between the inner shroud 110 and the outer shroud 120. The first airfoil 101 and the second airfoil 115 are at least partially coated with a MCrAlY coating 202 (shown in FIG. 2). At least the first suction side 107 comprises a coated surface section 104 which is coated with a thermal barrier coating (TBC) and which represents at least a part of the total surface of the first suction side 107.

Furthermore, at least the inner shroud 110 or the outer shroud 120 comprises a further coated surface section 106 which is coated with a further thermal barrier coating.

Specifically, the inner shroud 110 comprises an inner platform 111 and the outer shroud 120 comprises a further inner platform 121. According to the view shown in FIG. 1, the shown inner platform 111, 121 may be the respective inner platform 111, 121 of the inner shroud 110 or of the outer shroud 120. To the respective inner platform 111, 121, the first airfoil 110 and the second airfoil 115 are attached. The inner platform 111, 121 is washed during operation of the gas turbine by a working fluid of the gas turbine. The inner platform 111 and/or the further inner platform 121 comprise(s) the further coated surface section 106 in the exemplary embodiment as shown in FIG. 1.

Furthermore, the flow direction F of the working fluid in the gas turbine is indicated by the arrow shown in FIG. 1. The working fluid streams firstly against the respective leading edges 102, 116 of the respective airfoils 101, 115. At the respective trailing edges 103, 117 of the respective airfoils 101, 115, the working fluid streams away from the respective airfoil 101, 115.

It has been found out that in a region along the inner platform 111, 121 downstream of the trailing edges 103, 117 of the airfoils 101, 115 the hottest spots caused by the working fluid exist. Hence, by the present invention, at the downstream section of the respective inner platforms 111, 121 between the respective trailing edges 103, 117 and respective trailing edges 112, 122 of the respective inner platforms 111, 121 the further coated surface section 106 is applied.

Additionally, the hottest sections of the surface of the respective airfoils 101, 115 have been measured in particular at the suction side 107, 118 of the respective airfoils 101, 115. Hence, as shown in FIG. 1, the coated surface section 104 is coated onto the first suction side 107 of the first airfoil 101 in order to increase the heat resistance. Furthermore, a respective coated surface section 104 may also be applied to a second suction side 118 of the second airfoil 115.

Figure 2:
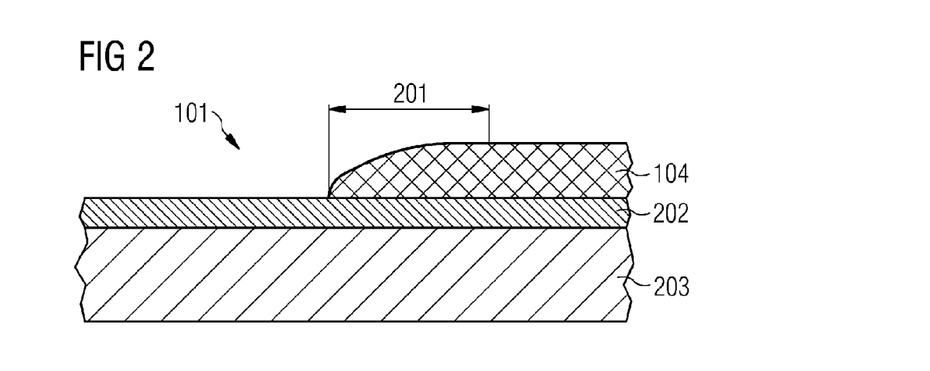
FIG. 2 shows an enlarged sectional view of a coated surface section of an airfoil as shown in FIG. 1 according to an exemplary embodiment of the present invention.

FIG. 2 shows a more detailed view of the coated surface section 104 at the first airfoil 101 as shown in FIG. 1.

To a substrate 203 of the first airfoil 101, a MCrAlY coating 202 may be applied in order to improve the oxidation resistance. On top of the MCrAlY coating 202, the thermal barrier coating of the coated surface section 104 is applied.

As shown in FIG. 2, the coated surface section 104 comprises a thinning out section 201. Within the thinning out section 201, the thickness of the thermal barrier layer in the coated surface section 104 is reduced till zero thickness at an end edge of the coated surface section 104.

Figure 3:
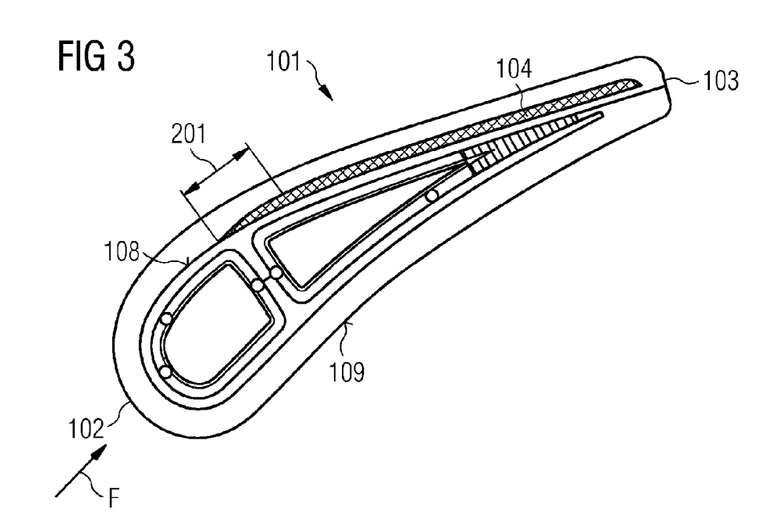
FIG. 3 shows a schematical view of an airfoil comprising a coated surface section according to an exemplary embodiment of the present invention.

FIG. 3 shows the first airfoil 101. The first airfoil 101 comprises the leading edge 102 and the trailing edge 103. Furthermore, the first airfoil 101 comprises a pressure side 109 and a suction side 108.

As shown in FIG. 3, the thermal barrier layer of the coated surface section 104 is located at the suction side 108 of the first airfoil 101. At the edge of the coated surface section 104 which is closer to the leading edge 102, a thinning out section 201 of the thermal barrier layer is applied in order to smoothly reduce the thickness of the thermal barrier layer till zero thickness.

Specifically, the coated surface section 104 is coated to the first airfoil 101 between a maximum airfoil thickness (measured e.g. along a line perpendicular to a chord line of a respective airfoil 101, 115) of the airfoil 101 and the trailing edge 103 of the first airfoil 101. The section between the edge of the coated surface section 104 and the leading edge 102 is kept free of any thermal barrier layer.

Furthermore, as shown in FIG. 3, the pressure side 109 may be kept free of a thermal barrier coating. Furthermore, at an upstream section of the respective inner platforms 111, 121 between the respective leading edges 102, 116 and respective upstream leading edges 112, 122 of the respective inner platforms 111, 121 the surfaces may be kept free of a thermal barrier coating. Hence, only at the hottest region of the airfoil 101, the thermal barrier coating is applied in order to effectively apply the thermal barrier coating and hence to reduce or minimise weight and costs.

The extension of the coated surface section 104 from the trailing edge 103 in the direction to the leading edge 102 may be for example 45 mm to approximately 50 mm, in particular approximately 48 mm. The dimension from the trailing edge 103 in the direction to the leading edge 102 of the aerofoil at 50% mid-span is approximately 60 mm. Thus for other aerofoils the extension of the coated surface section 104 from the trailing edge 103 in the direction to the leading edge 102 may be for example 75% to approximately 83-6, in particular approximately 80%. In other applications the coated surface section may extend in to the region between 50% and 80%. Although it is advantageous that the coated surface section extends from the trailing edge 103, the coated surface section may extend from within 10% of the dimension between trailing and leading edges of the aerofoil of the trailing edge and more particularly 5%.

The length of the thinning out section 201 along a direction 103 to the leading edge 102 may be between approximately 1 mm and approximately 10 mm. For this and other examples, the length of the thinning out section may be between 1% and 20% of the dimension along a direction 103 to the leading edge 102.

Particularly where a TBC is applied for a retrofit it is advantageous to avoid applying the TBC in the region of the throat plane such that the design area of the throat is altered significantly. A particular region about the throat plane to be free from a thermal barrier coating may be within 10% of the dimension between leading and trailing edges of the aerofoil and more particularly 5%.

Figure 4:
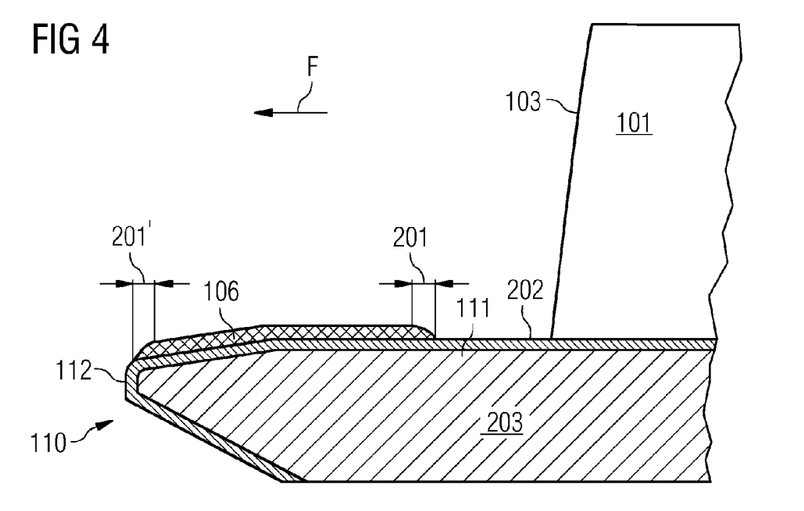
FIG. 4 shows a schematical view of an inner platform of a vane segment comprising a further coated surface section according to an exemplary embodiment of the present invention.

FIG. 4 shows an enlarged view of the inner shroud 110. The outer shroud 120 may be formed in a similar design.

Between a trailing edge 103 of the first airfoil 101 and the trailing edge 112 of the inner platform 111 of the inner shroud 110, the further coated surface section 106 comprising the TBC coating is applied. At the respective upstream and downstream edges of the further coated surface section 106, a respective thinning out section 201, 201' is formed at which the thermal barrier coating is reduced till zero thickness. As shown in FIG. 4, a MCrAlY coating 202 is applied to the substrate 203. The MCrAlY coating 202 may be applied along the inner surface of the inner platform 111 and around the trailing edge 112 of the inner platform 111. The further coated surface section 106 is only applied at the inner surface of the inner platform 111 where the working fluid washes and contacts the surface of the inner platform 111.

The width of the further coated surface section 106 between the upstream end and downstream end may comprise approximately 8 mm to approximately 12 mm, particularly 8 mm. In this example, the dimension from the platform trailing edge to aerofoil trailing edge is approximately 15 mm. In other applications the further coated surface section 106 has a width extending from the platform or shroud trailing edge a distance between approximately 50% to approximately 80%, particularly 53% of the dimension from the platform trailing edge to aerofoil trailing edge. However, in other applications of the present invention the further coated surface section 106 may extend between and including the upstream end and downstream end or the platform trailing edge to aerofoil trailing edge. The further coated surface section 106 may extend within 5% of the length from the platform trailing edge to the aerofoil trailing edge of either or both trailing edges.

For other applications of the present invention and particularly retrofitted TBC, where the platform or shroud includes cooling holes, the thermal barrier coating is applied from the trailing edge of the platform or shroud and curtailed close to the cooling holes to prevent the holes being blocked by the TBC.

The length of the thinning out section 201 of the further coated surface section 106 may be approximately 2 mm to approximately 4 mm, particularly approximately 3 mm. In other applications of the present invention, the thinning out section may extend in length within the range 5% to 40% of the length from the platform trailing edge to the aerofoil trailing edge.

In this exemplary embodiment the further coated surface section 106 extends over the full circumferential length of the platform surface. The upstream edge of the further coated surface section 106 may be a straight circumferential line or may be non-linear or arcuate to accommodate local fluctuations in temperature or aerodynamic profiles or cooling hole patterns in the platform or shroud.

Figure 5:
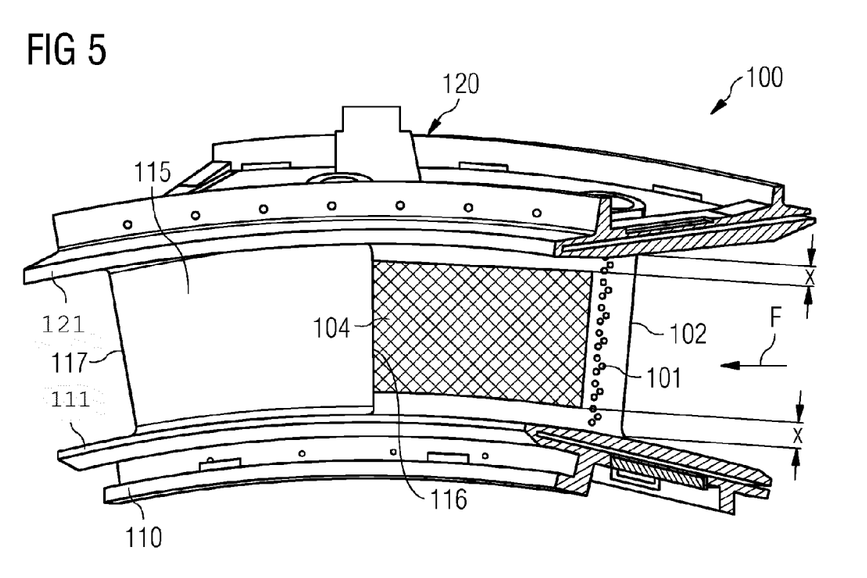
FIG. 5 shows a perspective view of a vane device according to an exemplary embodiment of the present invention.

FIG. 5 shows a perspective view of the vane device 100, wherein the vane device 100 comprises the inner shroud 110, the outer shroud 120, the first airfoil 101 and the second airfoil 115. The vane device 100 as shown in FIG. 5 may have the same features as shown in the sectional view shown in FIG. 1. Additionally, FIG. 5 shows the coated surface section 104, wherein the coated surface section 104 is spaced from the first leading edge 102 of the first airfoil 101, as shown for example in FIG. 3. Furthermore, the coated surface section 104 is spaced apart by a distance x from the inner platform 111 and the further inner platform 121, for example.

In particular, the sections between the inner platform and the edges of the coated surface section 104 (i.e. so-called fillet sections) may be free of the thermal barrier coating. Fillet sections may be coated by the MCrAlY coating, for example.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

The invention claimed is:

1. A vane device for a gas turbine, the vane device comprising:
   a first airfoil comprising a first suction side and a first pressure side,
   a second airfoil comprising a second suction side and a second pressure side,
   an inner shroud, and
   an outer shroud,
   wherein the first airfoil and the second airfoil are arranged between the inner shroud and the outer shroud,
   wherein the first airfoil and the second airfoil are at least partially coated with a MCrAlY coating,
   wherein at least the first suction side comprises a coated surface section which is coated with a thermal barrier coating and which represents at least a part of the total surface of the first suction side, and
   wherein at least the inner shroud or the outer shroud comprises a further coated surface section which is coated with a further thermal barrier coating,
   wherein the inner shroud comprises an inner platform, and
   wherein the outer shroud comprises a further inner platform,
   wherein an inner surface of the inner platform and a further inner surface of the further inner platform are washed during operation of the gas turbine by a working fluid of the gas turbine,
   wherein the inner surface of the inner platform and/or the further inner surface of the further inner platform comprises the further coated surface section,
   wherein the first airfoil further comprises a first leading edge and a first trailing edge,
   wherein the second airfoil further comprises a second leading edge and a second trailing edge,
   wherein the further coated surface section is located onto the inner platform and/or the further inner platform at a section which is located downstream of the first trailing edge and the second trailing edge,
   wherein the first pressure side and the second pressure side are free of a thermal barrier coating, and wherein the further coated surface section has a width extending from the platform trailing edge a distance between approximately 50% to approximately 80% of a dimension from the platform trailing edge to aerofoil trailing edge,
wherein the thermal barrier coating and/or the further thermal barrier coating comprises a thinning out section,
wherein in the thinning out section the thickness of the thermal barrier coating is smoothly reduced in a direction to an edge of the respective coated surface section and/or the further coated surface section.

2. The vane device according to claim 1,
wherein the thermal barrier coating has a thickness between 0.10 mm to 0.75 mm.

3. The vane device according to claim 1,
wherein the thermal barrier coating has a thickness between 0.15 mm to 0.5 mm.

4. The vane device according to claim 1,
wherein the first airfoil and the second airfoil partly define a throat area, and
wherein the first pressure side and the second pressure side are free of a thermal barrier coating in the throat area.

5. The vane device according to claim 1,
wherein the extension of the coated surface section from the trailing edge in the direction to the leading edge is in the region between 50% and 80% of the dimension in the direction between the trailing edge and the leading edge of the aerofoil.

6. A method for manufacturing a vane device for a gas turbine,
wherein the vane device comprises a first airfoil with a first suction side and a first pressure side, a second airfoil with a second suction side and a second pressure side, an inner shroud and an outer shroud, wherein the first airfoil and the second airfoil are arranged between the inner shroud and the outer shroud, the method comprising:
at least partially coating the first airfoil and the second airfoil with a MCrAlY coating,
coating a coated surface section with a thermal barrier coating,
wherein the first coated surface section is formed at least onto the first suction side, and
wherein the first coated surface section represents at least a part of the total surface of the first suction side,
coating a further coated surface section with a further thermal barrier coating,
wherein at least the inner shroud or the outer shroud comprises the further coated surface section,
wherein the inner shroud comprises an inner platform, and
wherein the outer shroud comprises a further inner platform,
wherein an inner surface of the inner platform and a further inner surface of the further inner platform are washed during operation of the gas turbine by a working fluid of the gas turbine,
wherein the inner surface of the inner platform and/or the further inner surface of the further inner platform comprises the further coated surface section,
wherein the first airfoil further comprises a first leading edge and a first trailing edge,
wherein the second airfoil further comprises a second leading edge and a second trailing edge,
wherein the further coated surface section is located onto the inner platform and/or the further inner platform at a section which is located downstream of the first trailing edge and the second trailing edge,
wherein the first pressure side and the second pressure side are free of a thermal barrier coating, and
wherein the further coated surface section has a width extending from the platform trailing edge a distance between approximately 50% to approximately 80% of a dimension from the platform trailing edge to aerofoil trailing edge,
wherein the thermal barrier coating and/or the further thermal barrier coating comprises a thinning out section,
wherein in the thinning out section the thickness of the thermal barrier coating is smoothly reduced in a direction to an edge of the respective coated surface section and/or the further coated surface section.

7. The method according to claim 6,
wherein the thermal barrier coating is applied by an Electron Beam Physical Vapour Deposition or an Air Plasma Spray (APS) process.

8. The method according to claim 6,
wherein the MCrAlY coating is applied by electroplating.

* * * * *